US012696612B2

(12) United States Patent
Wang

(10) Patent No.: US 12,696,612 B2
(45) Date of Patent: Jul. 28, 2026

(54) MANUFACTURING METHOD FOR PATTERNED QUANTUM DOT FILM LAYER COMPRISING REPLACING NATIVE LIGANDS OF QUANTUM DOT THIN FILM BY REPLACEMENT LIGANDS

(71) Applicant: BOE Technology Group Co., Ltd., Beijing (CN)

(72) Inventor: Haowei Wang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 559 days.

(21) Appl. No.: 18/033,489

(22) PCT Filed: Dec. 16, 2020

(86) PCT No.: PCT/CN2020/136904

§ 371 (c)(1),
(2) Date: Apr. 24, 2023

(87) PCT Pub. No.: WO2022/126444

PCT Pub. Date: Jun. 23, 2022

(65) Prior Publication Data

US 2023/0403922 A1 Dec. 14, 2023

(51) Int. Cl.
*H10K 50/115* (2023.01)
*H10K 71/10* (2023.01)
(Continued)

(52) U.S. Cl.
CPC ........... *H10K 50/115* (2023.02); *H10K 71/12* (2023.02); *H10K 71/191* (2023.02); *H10K 71/221* (2023.02)

(58) Field of Classification Search
None
See application file for complete search history.

(56) References Cited

U.S. PATENT DOCUMENTS

| | | | | |
|---|---|---|---|---|
| 2009/0184636 A1* | 7/2009 | Cok | ................. | H10K 59/80524 313/505 |
| 2019/0312204 A1 | 10/2019 | Kang et al. | | |
| 2020/0259110 A1* | 8/2020 | Angioni | ................. | H10K 50/15 |

FOREIGN PATENT DOCUMENTS

| | | |
|---|---|---|
| CN | 102779943 A | 11/2012 |
| CN | 109935665 A | 6/2019 |

(Continued)

OTHER PUBLICATIONS

PCT/CN2020/136904 international search report.

*Primary Examiner* — Daniel Whalen
(74) *Attorney, Agent, or Firm* — IPro, PLLC

(57) ABSTRACT

A patterned quantum dot film layer, a quantum dot light-emitting device and a manufacturing method. The manufacturing method includes: forming a patterned mask layer on one side of a base substrate; forming a quantum dot thin film on the side of the mask layer that faces away from the base substrate, the quantum dot thin film includes quantum dot bodies and native ligands connected to the quantum dot bodies; forming, on the side of the quantum dot thin film that faces away from the mask layer, a ligand thin film that includes replacement ligands, and leaving same to stand for a first duration, such that the native ligands are replaced by the replacement ligands; performing cleaning by means of a cleaning solvent, removing unreacted replacement ligands and replaced native ligands; peeling off the mask layer, and removing together the quantum dot thin film attached to the mask layer.

9 Claims, 6 Drawing Sheets

(51) Int. Cl.
*H10K 71/12* (2023.01)
*H10K 71/20* (2023.01)

(56) References Cited

FOREIGN PATENT DOCUMENTS

| | | | |
|---|---|---|---|
| CN | 110224074 | A | 9/2019 |
| CN | 111117603 | A | 5/2020 |
| JP | 2015050204 | A | 3/2015 |

* cited by examiner

MANUFACTURING METHOD FOR PATTERNED QUANTUM DOT FILM LAYER COMPRISING REPLACING NATIVE LIGANDS OF QUANTUM DOT THIN FILM BY REPLACEMENT LIGANDS

CROSS-REFERENCE TO RELATED APPLICATIONS

This application is a National Stage of International Application No. PCT/CN2020/136904, filed Dec. 16, 2020, which is hereby incorporated by reference in its entirety.

FIELD

The present disclosure relates to the technical field of semiconductors, in particular to a patterned quantum dot film layer, a quantum dot light-emitting device and a manufacturing method.

BACKGROUND

High-resolution patterned quantum dots are a key technology to realize next generation quantum dot display, and quantum dot materials, due to their inherent properties, are highly likely to replace an organic light-emitting display technology and become a leader of a next generation display technology. At present, printing and printing methods commonly employed result in an extremely limited resolution. Therefore, it is imperative to develop a high-resolution quantum dot patterning technology.

With deep development of a quantum dot technology, the research of a quantum dot light-emitting technology is increasingly deep, the quantum efficiency is continuously improved, which has basically reached the level of industrialization, and further adoption of new processes and technologies to achieve its industrialization has become a trend in the future. The use of quantum dots for patterning to achieve manufacture of a high-resolution display device has become an important issue.

SUMMARY

An embodiment of the present disclosure provides a manufacturing method for a patterned quantum dot film layer, including: forming a patterned mask layer on one side of a base substrate, wherein the patterned mask layer exposes a target region in which quantum dot bodies are to be formed; forming a quantum dot thin film on the side, facing away from the base substrate, of the mask layer, wherein the quantum dot thin film includes quantum dot bodies, and native ligands connected to the quantum dot bodies; forming a ligand thin film containing replacement ligands on the side, facing away from the mask layer, of the quantum dot thin film, and standing for a first duration, such that the native ligands are replaced by the replacement ligands; performing cleaning by a cleaning solvent to remove unreacted replacement ligands and replaced native ligands, wherein the quantum dot bodied connected to the replacement ligands after replacement are not removed by the cleaning solvent; and peeling off the mask layer, and together removing the quantum dot thin film attached to the mask layer, so as to form a pattern part of a quantum dot film layer in the target region.

In one possible embodiment, the forming the ligand thin film containing the replacement ligands on the side, facing away from the mask layer, of the quantum dot thin film, and standing for the first duration, such that the native ligands are replaced by the replacement ligands includes: forming the ligand thin film containing ligands having a plurality of coordinating terminals on the side, facing away from the mask layer, of the quantum dot thin film, wherein each ligand having the plurality of coordinating terminals includes a linking group, and a plurality of terminal coordinating groups connected to the linking group; and replacing the native ligands by the ligands having the plurality of coordinating terminals, and connecting different terminal coordinating groups of a same ligand having the plurality of coordinating terminals to different quantum dot bodies, so that different quantum dot bodies are crosslinked with each other through the ligands having the plurality of coordinating terminals.

In one possible embodiment, the forming the ligand thin film containing the ligands having the plurality of coordinating terminals on the side, facing away from the mask layer, of the quantum dot thin film includes: forming, on the side, facing away from the mask layer, of the quantum dot thin film, the ligand thin film with the terminal coordinating groups containing one of amino, polyamino, hydroxyl, polyhydroxy, mercapto, polythiol, thioether, polythioether, phosphine and phosphine oxide.

In one possible embodiment, the forming the ligand thin film containing the ligands having the plurality of coordinating terminals on the side, facing away from the mask layer, of the quantum dot thin film includes: forming, on the side, facing away from the mask layer, of the quantum dot thin film, the ligand thin film with the linking groups containing one of ethyl, n-butyl, tert-butyl, n-octyl, tert-butylphenyl, methoxy and n-butoxy.

In one possible embodiment, the forming the ligand thin film containing the ligands having the plurality of coordinating terminals on the side, facing away from the mask layer, of the quantum dot thin film includes: forming the ligand thin film containing 1,12-dodecyldithiol on the side, facing away from the mask layer, of the quantum dot thin film.

In one possible embodiment, the forming the ligand thin film containing the replacement ligands on the side, facing away from the mask layer, of the quantum dot thin film, and standing for the first duration, such that the native ligands are replaced by the replacement ligands includes: forming the ligand thin film containing insoluble ligands on the side, facing away from the mask layer, of the quantum dot thin film, wherein a chain length of each insoluble ligand is less than a chain length of each native ligand; and replacing the native ligands by the insoluble ligands, so that the quantum dot bodies are adsorbed onto the base substrate.

In one possible embodiment, the forming the ligand thin film containing the insoluble ligands on the side, facing away from the mask layer, of the quantum dot thin film includes: forming the ligand thin film containing an inorganic salt or containing an organic salt on the side, facing away from the mask layer, of the quantum dot thin film.

In one possible embodiment, the forming the ligand thin film containing the insoluble ligands on the side, facing away from the mask layer, of the quantum dot thin film includes: forming, on the side, facing away from the mask layer, of the quantum dot thin film, the ligand thin film containing one of iodide ions, chloride ions, bromide ions, $—S^{2-}$, $—HS^-$, $—Se^{2-}$, $—HSe^-$, $—Te^{2-}$, $—HTe^-$, $—TeS_3^{2-}$, $—OH^-$, $—NH^{2-}$, $—Sn_2S_6^{4-}$, $—N_2H_5^+$, $—CdCl_3^-$, $—Te^{2-}$, $—PO_4^{3-}$ and $—MoO_4^{2-}$.

In one possible embodiment, the forming the ligand thin film containing the replacement ligands on the side, facing away from the mask layer, of the quantum dot thin film, and standing for the first duration, such that the native ligands are replaced by the replacement ligands includes: forming the ligand thin film containing the replacement ligands on the side, facing away from the mask layer, of the quantum dot thin film, and standing for the first duration under the condition of no ultraviolet light source irradiation, such that the native ligands are replaced by the replacement ligands.

In one possible embodiment, the forming the quantum dot thin film on the side, facing away from the base substrate, of the mask layer includes: forming a quantum dot thin film containing quantum dot bodies, and oleic acid ligands connected to the quantum dot bodies on the side, facing away from the base substrate, of the mask layer.

An embodiment of the present disclosure also provides a patterned quantum dot film layer, wherein the patterned quantum dot film layer has a plurality of pattern parts including quantum dot bodies, and replacement ligands connected to the quantum dot bodies.

In one possible embodiment, the replacement ligands are ligands having a plurality of coordinating terminals, wherein each ligand having the plurality of coordinating terminals includes: a linking group, and a plurality of terminal coordinating groups connected to the linking group; wherein different terminal coordinating groups of a same ligand having the plurality of coordinating terminals are connected to different quantum dot bodies, so that different quantum dot bodies are crosslinked with each other through the ligands having the plurality of coordinating terminals.

In one possible embodiment, the linking group includes one sub-linking group, and the plurality of the terminal coordinating groups are connected to the same sub-linking group.

In one possible embodiment, the linking group includes a plurality of sub-linking groups which are connected sequentially; and at least one of the terminal coordinating groups is connected to each sub-linking group.

In one possible embodiment, the sub-linking groups are the same; or, the sub-linking groups are different from each other.

In one possible embodiment, the sub-linking group is an alkyl chain.

In one possible embodiment, the sub-linking group includes one of ethyl, n-butyl, tert-butyl, n-octyl, tert-butylphenyl, methoxy and n-butoxy.

In one possible embodiment, the terminal coordinating group includes one of: amino, polyamino, hydroxyl, polyhydroxy, mercapto, polythiol, thioether, polythioether, phosphine and phosphine oxide.

In one possible embodiment, the replacement ligands are insoluble ligands.

In one possible embodiment, the insoluble ligand is one of: iodide ions, chloride ions, bromide ions, $—S^{2-}$, $—HS^-$, $—Se^{2-}$, $—HSe^-$, $—Te^{2-}$, $—HTe^-$, $—TeS_3^{2-}$, $—OH^-$, $—NH^{2-}$, $—Sn_2S_6^{4-}$, $—N_2H_5^+$, $—CdCl_3^-$, $—Te^{2-}$, $—PO_4^{3-}$ and $—MoO_4^{2-}$.

An embodiment of the present disclosure also provides a quantum dot light-emitting device, including: a base substrate, a first electrode stacked on one side of the base substrate, a quantum dot film layer, and a second electrode; wherein the quantum dot film layer includes the patterned quantum dot film layer provided by the embodiment of the present disclosure.

DETAILED DESCRIPTION OF THE EMBODIMENTS

In order to make the objectives, technical solutions, and advantages of the embodiments of the present disclosure clearer, the technical solutions of the embodiments of the present disclosure will be described clearly and completely below with reference to the accompanying drawings of the embodiments of the present disclosure. Apparently, the described embodiments are some, not all, of the embodiments of the present disclosure. Based on the described embodiments of the present disclosure, all other embodiments obtained by those of ordinary skill in the art without creative efforts fall within the protection scope of the present disclosure.

Unless otherwise defined, technical or scientific terms used in the present disclosure shall have the ordinary meaning as understood by those of ordinary skill in the art to which the present disclosure belongs. The terms “first”, “second”, and the like used in the present disclosure do not represent any order, quantity, or importance, but are merely used to distinguish different components. Similar words such as “include” or “comprise” mean that an element or item preceding the word covers elements or items listed behind the word and their equivalents without excluding other elements or items. Similar words such as “connection” or “connected” are not limited to physical or mechanical connection, but can include electrical connection, whether direct or indirect. The “upper”, “lower”, “left”, “right” and the like are only used for representing a relative position relation, and when an absolute position of the described object is changed, the relative position relation can also be correspondingly changed.

To keep the following description of the embodiments of the present disclosure clear and concise, the present disclosure omits detailed descriptions of known functions and known components.

Figure 1:
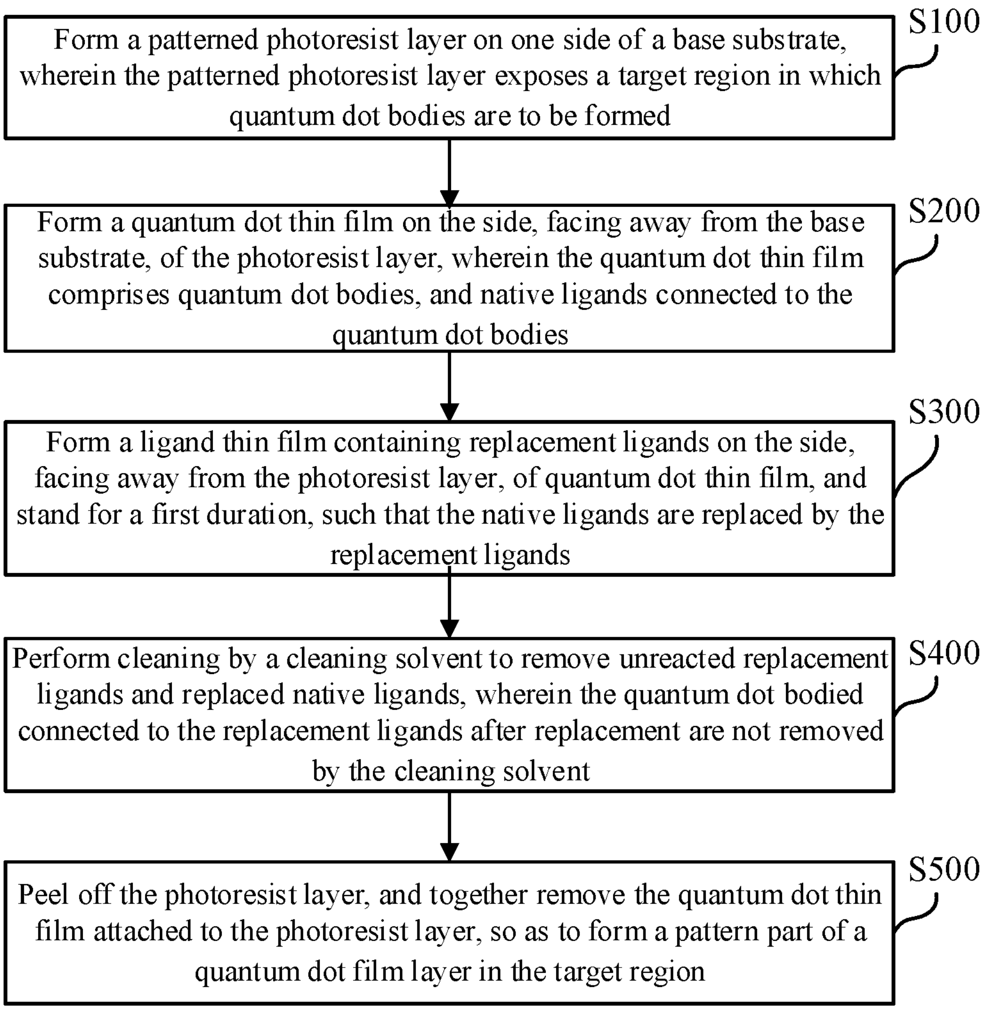
FIG. 1 is a schematic diagram of a manufacturing process of a patterned quantum dot film layer according to an embodiment of the present disclosure.
Figure 2:
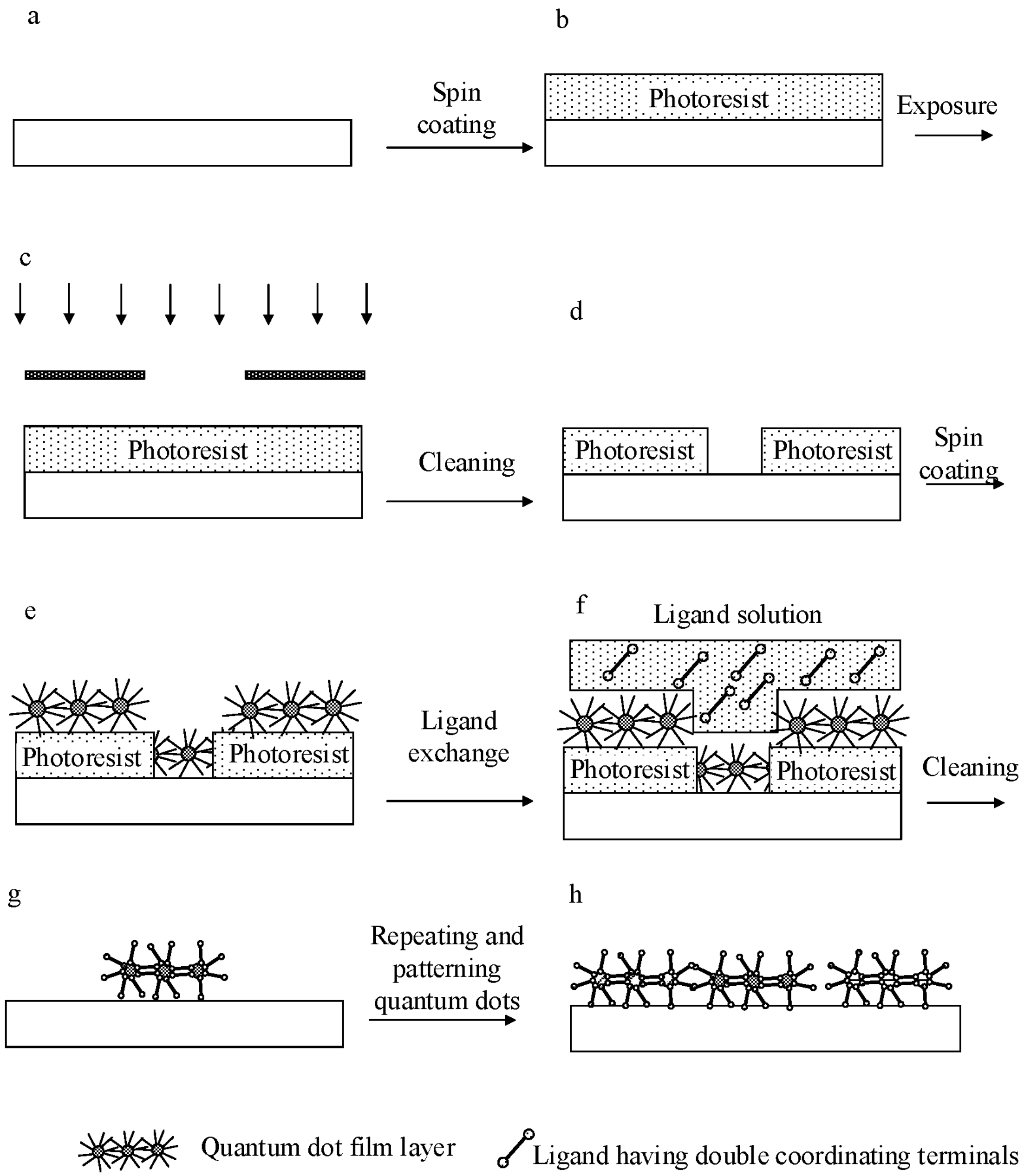
FIG. 2 is a schematic diagram of a specific manufacturing process of the patterned quantum dot film layer according to the embodiment of the present disclosure.

Referring to FIGS. 1 and 2, an embodiment of the present disclosure provides a manufacturing method for a patterned quantum dot film layer, including followings.

Step S100, forming a patterned mask layer on one side of a base substrate, wherein the patterned mask layer exposes a target region in which quantum dot bodies are to be formed, as shown in FIG. 2 by steps a-d; in particular, the target region may be a region in which quantum dot bodies need to be formed in a current once patterning process, for example, the finally formed quantum dot film layer may include a red quantum dot pattern part emitting red light, a green quantum dot pattern part emitting green light, and a blue quantum dot pattern part emitting blue light, the three quantum dot pattern parts can be specifically formed by a process for patterning for three times, and when the red quantum dot pattern part is formed, the target region is a region in which the red quantum dot pattern part needs to be formed; when the green quantum dot pattern part is formed, the target region is a region in which the green quantum dot pattern part needs to be formed; when the blue quantum dot pattern part is formed, the target region is a region in which the blue quantum dot pattern part needs to be formed; in particular, the mask layer may be a photoresist layer or may be a composite structure including a photoresist layer and a sacrificial layer, wherein the sacrificial layer is located between the photoresist layer and a position facing away from the base substrate.

Step S200, forming a quantum dot thin film on the side, facing away from the base substrate, of the mask layer, wherein the quantum dot thin film includes quantum dot bodies, and native ligands connected to the quantum dot bodies, as shown in FIG. 2 by a step e.

In specific implementation, the native ligands may be conventional ligands that enable the formation of quantum dot bodies on the base substrate, for example, the native ligands may be oleic acid, and accordingly, the step S100 of forming the patterned mask layer on one side of the base substrate may include: forming a quantum dot thin film containing quantum dot bodies, and oleic acid ligands connected to the quantum dot bodies on the side, facing away from the base substrate, of the mask layer.

It needs to be understood that the native ligands may be common ligands used in manufacturing a quantum dot light-emitting device, the quantum dot bodies cannot be spin coated without the native ligands, and will directly coagulate, making it difficult to form directly on the base substrate in the form of a thin film, and the native ligands not only play a role in passivating the surface defect states of quantum dots, but also play a role in dissolving and dispersing the quantum dot bodies in a solvent, which is conducive to forming the quantum dot bodies on the base substrate in the form of a thin film.

Step S300, forming a ligand thin film containing replacement ligands on the side, facing away from the mask layer, of the quantum dot thin film, and standing for a first duration, such that the native ligands are replaced by the replacement ligands, as shown in FIG. 2 by a step f; in particular, the coordination capacity of the replacement ligands to the quantum dot bodies is stronger than the coordination capacity of the native ligands to the quantum dot bodies, then achieving replacement of the native ligands from the quantum dot bodies, e.g., a binding force of ligands having double coordinating terminals (such as a mercapto coordinating terminal) to the quantum dot bodies is greater than a binding force of the native ligands (such as oleic acid) to the quantum dot bodies, and replacement of the native ligands by the replacement ligands can be achieved according to the Hard-Soft-Acid-Base (HSAB) theory.

In specific implementation, the replacement ligands may be ligands having a plurality of coordinating terminals, in connection with FIGS. 3 to 6, FIG. 3 is a comparative schematic structural diagram of native ligands X1 connected to quantum dot bodies QDs, and replacement ligands X2 connected to quantum dot bodies QD before and after ligand exchange, and a specific description is as follows.

Figure 4:
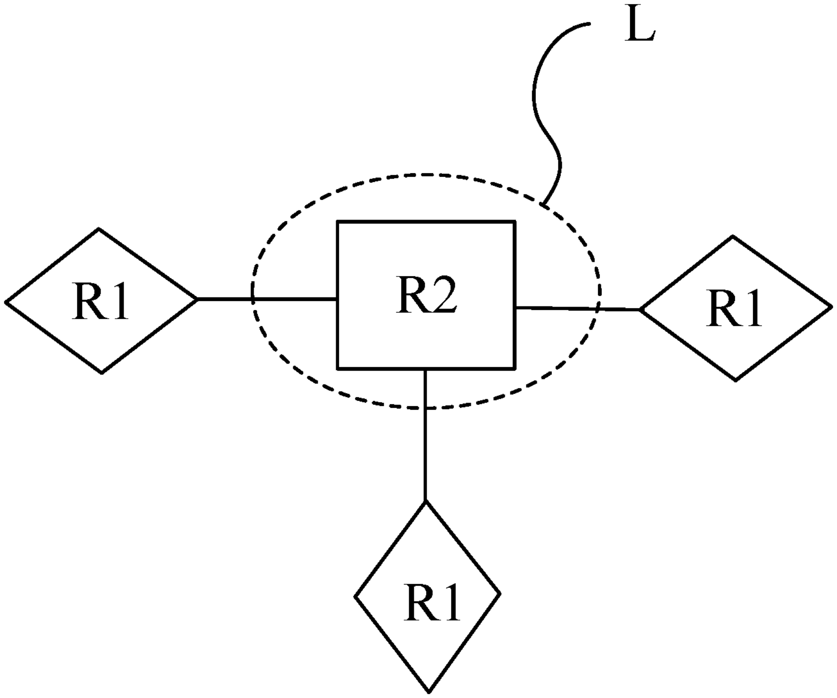
FIG. 4 is a first schematic diagram of a ligand having a plurality of coordinating terminals according to an embodiment of the present disclosure.
Figure 5:
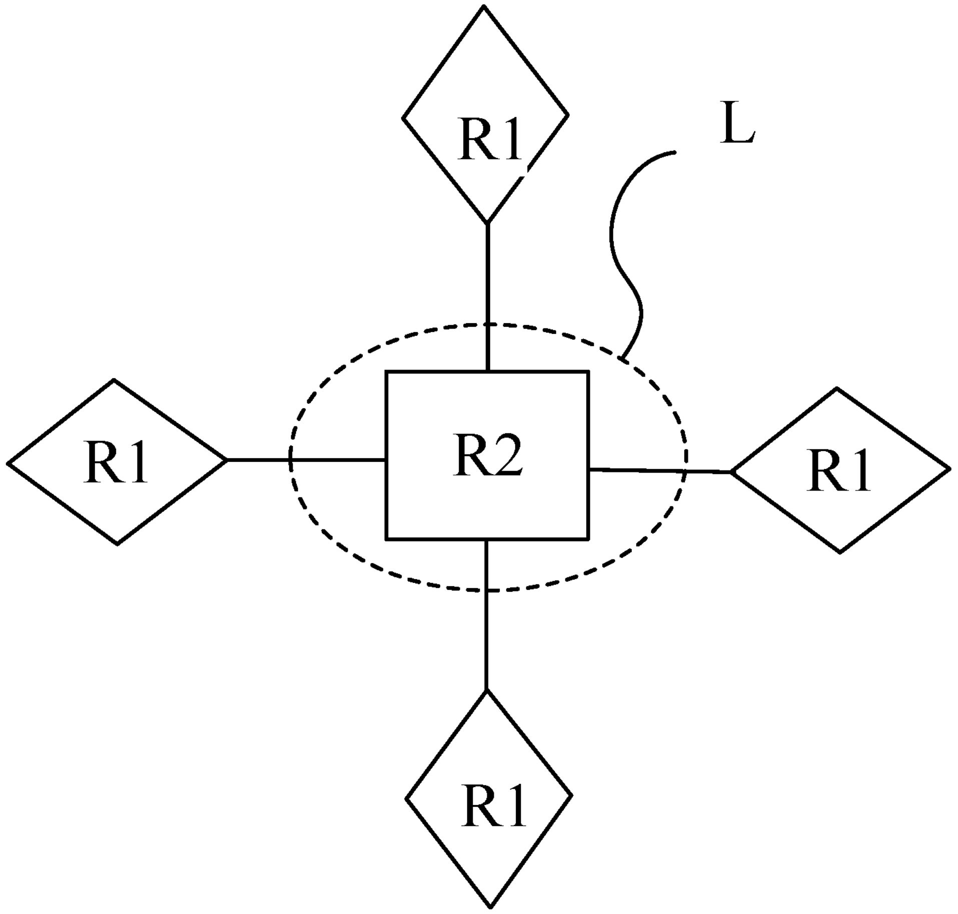
FIG. 5 is a second schematic diagram of a ligand having a plurality of coordinating terminals according to an embodiment of the present disclosure.
Figure 6:
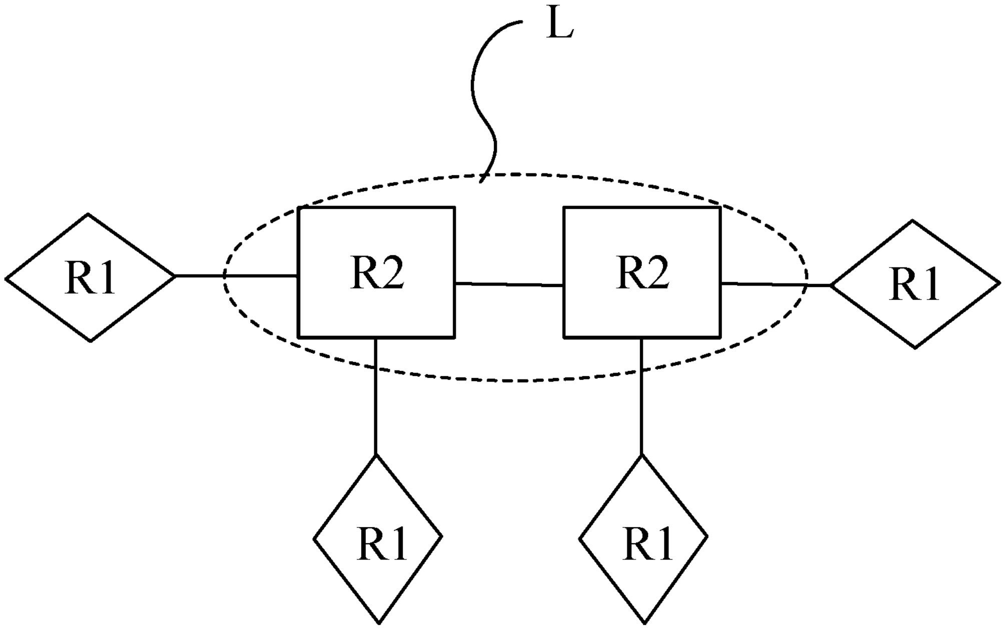
FIG. 6 is a third schematic diagram of a ligand having a plurality of coordinating terminals according to an embodiment of the present disclosure.

Before replacement, in connection with FIGS. 4, 5, and 6, the ligand X2 having the plurality of coordinating terminals includes a linking group L, and a plurality of terminal coordinating groups R1 connected to the linking group L; in particular, the linking group L may include one sub-linking group R2, and as shown in FIG. 4, and FIG. 5, the plurality of terminal coordinating groups R1 are connected to the same sub-linking group R2; in particular, the linking group L may also include a plurality of sub-linking groups R2, and as shown in FIG. 6, the plurality of sub-linking groups R2 are connected sequentially; at least two terminal coordinating groups R1 are connected to each sub-linking group R2; in particular, the sub-linking groups R2 may be the same; or, the sub-linking groups R2 may be different from each other; in particular, the sub-linking group R2 may be an alkyl chain, further, the sub-linking group R2 may include one of: ethyl; n-butyl; tert-butyl; n-octyl; tert-butylphenyl; methoxy; and n-butoxy; and in specific implementation, before replacement, the terminal coordinating group R1 can include one of amino; polyamino; hydroxy; polyhydroxy; mercapto; polythiol; thioether; polythioether; phosphine; and phosphine oxide.

Figure 3:
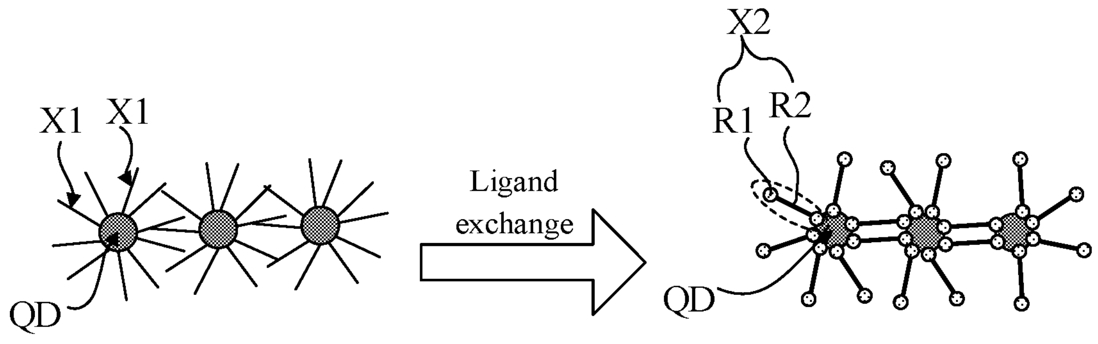
FIG. 3 is a schematic diagram of a ligand exchange process according to an embodiment of the present disclosure.

After replacement, in connection with FIG. 3, different terminal coordinating groups R1 of a same ligand having a plurality of coordinating terminals are connected to different quantum dot bodies QDs, so that different quantum dot bodies QDs are crosslinked with each other through the ligands having the plurality of coordinating terminals, that is, the same ligand having the plurality of coordinating terminals contains a plurality of terminal coordinating groups R1, and the plurality of terminal coordinating groups R1 can be connected to a plurality of quantum dot bodies QDs, thereby linking together the plurality of quantum dot bodies QDs by the ligands having the plurality of coordinating terminals, in particular, for example, the ligand having the plurality of coordinating terminals is a ligand having double coordinating terminals as shown in FIG. 3, in the structure after ligand exchange on the right side of FIG. 3, a quantum dot body QD in the middle and a quantum dot body QD on the left are linked together by two terminal coordinating groups R1 of the same ligand having the plurality of coordinating terminals, weak ligands on the surfaces of the quantum dot bodies are subjected to ligand exchange by strong coordination bonds of the ligand having double coordinating terminals, and both ends are subjected to ligand exchange to achieve cross-linking of the quantum dot bodies, and the cross-linked quantum dot bodies are not easily soluble in a cleaning solvent, thus reducing the probability of the quantum dot bodies being cleaned away during cleaning.

In specific implementation, when the replacement ligands are ligands having a plurality of coordinating terminals, the step S300 of forming the ligand thin film containing the replacement ligands on the side, facing away from the mask layer, of the quantum dot thin film, and standing for the first duration, such that the native ligands are displaced by the replacement ligands includes:

Step S311, forming the ligand thin film containing ligands having a plurality of coordinating terminals on the side, facing away from the mask layer, of the quantum dot thin film, wherein each ligand having the plurality of coordinating terminals includes a linking group, and a plurality of terminal coordinating groups connected to the linking group; and Step S312, replacing the native ligands by the ligands having the plurality of coordinating terminals, and connecting different terminal coordinating groups of a same ligand having the plurality of coordinating terminals to different quantum dot bodies, so that different quantum dot bodies are crosslinked with each other through the ligands having the plurality of coordinating terminals.

Further, the step S311 of forming the ligand thin film containing the ligands having the plurality of coordinating terminals on the side, facing away from the mask layer, of the quantum dot thin film includes forming, on the side, facing away from the mask layer, of the quantum dot thin film, the ligand thin film with the terminal coordinating groups containing one of amino, polyamino, hydroxyl, polyhydroxy, mercapto, polythiol, thioether, polythioether, phosphine, and phosphine oxide.

Further, the step S311 of forming the ligand thin film containing the ligands having the plurality of coordinating terminals on the side, facing away from the mask layer, of the quantum dot thin film includes forming, on the side, facing away from the mask layer, of the quantum dot thin film, the ligand thin film with the linking groups containing one of: ethyl, n-butyl, tert-butyl, n-octyl, tert-butylphenyl, methoxy, and n-butoxy.

In particular, the step S311 of forming the ligand thin film containing the ligands having the plurality of coordinating terminals on the side, facing away from the mask layer, of the quantum dot thin film may include forming the ligand thin film containing 1,12-dodecyldithiol on the side, facing away from the mask layer, of the quantum dot thin film.

Figure 7:
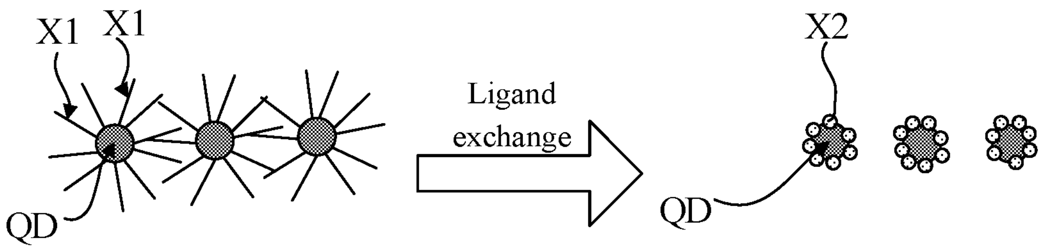
FIG. 7 is a schematic diagram of another ligand exchange process according to an embodiment of the present disclosure.

In specific implementation, the replacement ligands may be insoluble ligands, in connection with FIG. 7, FIG. 7 is a comparative schematic structural diagram of native ligands X1 connected to quantum dot bodies QDs, and replacement ligands X2 connected to quantum dot bodies QD before and after ligand exchange, and a specific description is as follows.

Before replacement, a structure containing the insoluble ligands may be an inorganic or organic salt, in particular an inorganic or organic salt containing, for example, iodide ions, chloride ions, bromide ions, $—S^{2-}$, $—HS^{-}$, $—Se^{2-}$, $—HSe^{-}$, $—Te^{2-}$, $—HTe^{-}$, $—TeS_3^{2-}$, $—OH^{-}$, $—NH^{2-}$, $—Sn_2S_6^{4-}$, $—N_2H_5^{+}$, $—CdCl_3^{-}$, $—Te^{2-}$, $—PO_4^{3-}$ or $—MoO_4^{2-}$, for example, tetrabutylammonium chloride, tetrabutylammonium bromide (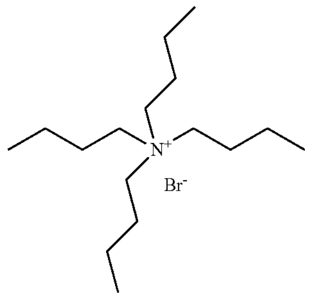), tetrabutylammonium iodide (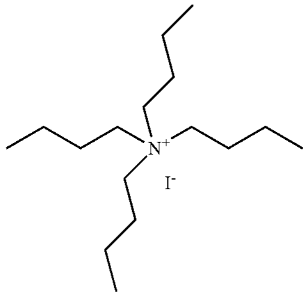), tetrapropylammonium bromide, or tetrapentylammonium telluride.

Figure 8:
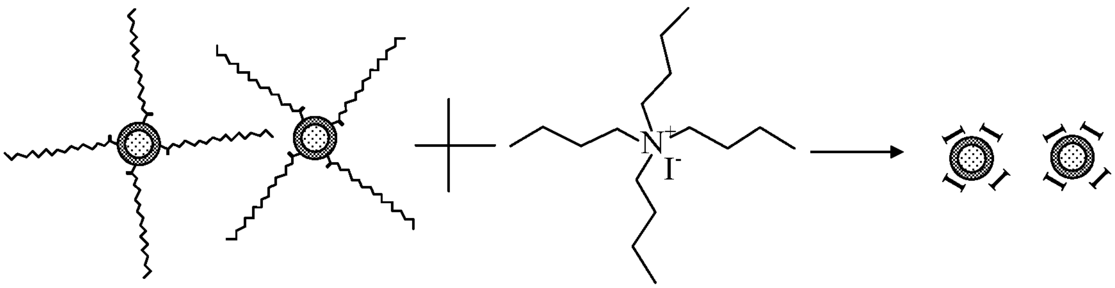
FIG. 8 is a schematic diagram of another specific ligand exchange process according to an embodiment of the present disclosure.

After replacement, in connection with FIG. 7, iodide ions, chloride ions, bromide ions, $—S^{2-}$, $—HS^{-}$, $—Se^{2-}$, $—HSe^{-}$, $—Te^{2-}$, $—HTe^{-}$, $—TeS_3^{2-}$, $—OH^{-}$, $—NH^{2-}$, $—Sn_2S_6^{4-}$, $—N_2H_5^{+}$, $—CdCl_3^{-}$, $—Te^{2-}$, $—PO_4^{3-}$ or $—MoO_4^{2-}$ is connected to the quantum dot bodies QDs as an insoluble ligand, e.g., specifically, in connection with FIG. 8, before replacement, quantum dots connected to oleic acid ligands are CdSe/CdS-OA, and after ligand exchange, the oleic acid ligands are replaced by the iodide ions to become CdSe/CdS—I; that is, the original native ligands of the quantum dot bodies are replaced by ligands such as halide ions that have a stronger coordination capacity to the quantum dot bodies than original native ligands of the quantum dot bodies, after replacing by the ligands such as halogen ions, due to a shorter chain length of the replacement ligands, the quantum dot bodies are equivalent to being adsorbed onto the front film layer, such quantum dot film layer is insoluble in general polar and non-polar solvents (if exchange of inorganic salt or halide ion ligands is carried out in a solution, quantum dots will coagulate directly), such quantum dot film layer is not cross-linked, but is insoluble in general solvents, thus reducing the probability of the quantum dot bodies being cleaned away during cleaning.

In specific implementation, when the replacement ligands are insoluble ligands, the step S300 of forming the ligand thin film containing the replacement ligands on the side, facing away from the mask layer, of the quantum dot thin film, and standing for the first duration includes follows.

Step S321, forming the ligand thin film containing insoluble ligands on the side, facing away from the mask layer, of the quantum dot thin film, wherein a chain length of each insoluble ligand is less than the chain length of each native ligand; further, the step may be: forming the ligand thin film containing an inorganic salt or containing an organic salt on the side, facing away from the mask layer, of the quantum dot thin film; and further, the step may be forming, on the side, facing away from the mask layer, of the quantum dot thin film containing one of: iodide ions, chloride ions, bromide ions, $—S^{2-}$, $—HS^{-}$, $—Se^{2-}$, $—HSe^{-}$, $—Te^{2-}$, $—HTe^{-}$, $—TeS_3^{2-}$, $—OH^{-}$, $—NH^{2-}$, $—Sn_2S_6^{4-}$, $—N_2H_5^{+}$, $—CdCl_3^{-}$, $—Te^{2-}$, $—PO_4^{3-}$, and $—MoO_4^{2-}$.

Step S322, replacing the native ligands by the insoluble ligands, so that the quantum dot bodies are adsorbed onto the base substrate.

Step S400, performing cleaning by a cleaning solvent to remove unreacted replacement ligands and replaced native ligands, wherein the quantum dot bodied connected to the replacement ligands after replacement are not removed by the cleaning solvent; in particular, performing cleaning by the cleaning solvent may include: performing cleaning for at least three times with acetonitrile, ethanol, methanol, or dimethyl sulfoxide under dynamic spin coating conditions.

Step S500, peeling off the mask layer, and together removing the quantum dot thin film attached to the mask layer, so as to form a pattern part of a quantum dot film layer in the target region, as shown in FIG. 2 by a step g.

In specific implementation, the step S300 of forming the ligand thin film containing the replacement ligands on the side, facing away from the mask layer, of the quantum dot thin film, and standing for the first duration, such that the native ligands are replaced by the replacement ligands may include forming the ligand thin film containing the replacement ligands on the side, facing away from the mask layer, of the quantum dot thin film, and standing for the first duration under the condition of no ultraviolet light source irradiation, such that the native ligands are replaced by the replacement ligands. Namely, according to the quantum dot patterning method provided by the embodiment of the present disclosure, cross-linking between different quantum dots can be achieved without the need for a special ultraviolet light source for ligand exchange (e.g. the ligands having the plurality of coordinating terminals may connect different quantum dots with each other), avoiding the use of photocrosslinking and photodestruction ligands in the quantum dot patterning process, which can greatly protect the quantum dots from being damaged by high-energy ultraviolet light, thereby improving the efficiency and service life of full-color quantum dot light-emitting devices.

In the embodiment of the present disclosure, after forming the quantum dot thin film, the ligand thin film containing the replacement ligands is formed on the quantum dot thin film, the native ligands are replaced by the replacement ligands, the replacement ligands are ligands that are not easily removed by cleaning with the cleaning solvent, thereby improving the problem that quantum dot bodies in the target region are easily removed by cleaning during the cleaning process when the quantum dot film layer is patterned in the prior art, and furthermore, the manufacturing process for the patterned quantum dot film layer can avoid the use of photocrosslinking and/or photodestruction ligands, which can greatly protect the quantum dots from being damaged by high-energy ultraviolet light, thereby improving the efficiency and service life of the quantum dot light-emitting device when the patterned quantum dot film layer is applied to a quantum dot light-emitting device.

Based on the same inventive concept, an embodiment of the present disclosure also provides a patterned quantum dot film layer manufactured by using the manufacturing method provided by the embodiment of the present disclosure, wherein the patterned quantum dot film layer has a plurality of pattern parts including quantum dot bodies, and replacement ligands connected to the quantum dot bodies.

In specific implementation, the patterned quantum dot film layer in embodiments of the present disclosure may be a light-emitting layer in a quantum dot light-emitting device or may be a quantum dot color film layer. The quantum dot light-emitting device may be a quantum dot light-emitting device emitting monochromatic light, e.g., a quantum dot light-emitting device emitting monochromatic red light, e.g., a quantum dot light-emitting device emitting green light, and a quantum dot light-emitting device emitting blue light. The quantum dot light-emitting device may also be a display device emitting a plurality of light colors, as the light-emitting layer, the quantum dot film layer may specifically include a plurality of quantum dot light-emitting portions emitting a plurality of different light colors, for example, the quantum dot film layer includes a red quantum dot light-emitting portion emitting red light, a green quantum dot light-emitting portion emitting green light, and a blue quantum dot light-emitting portion emitting blue light.

Figure 9:
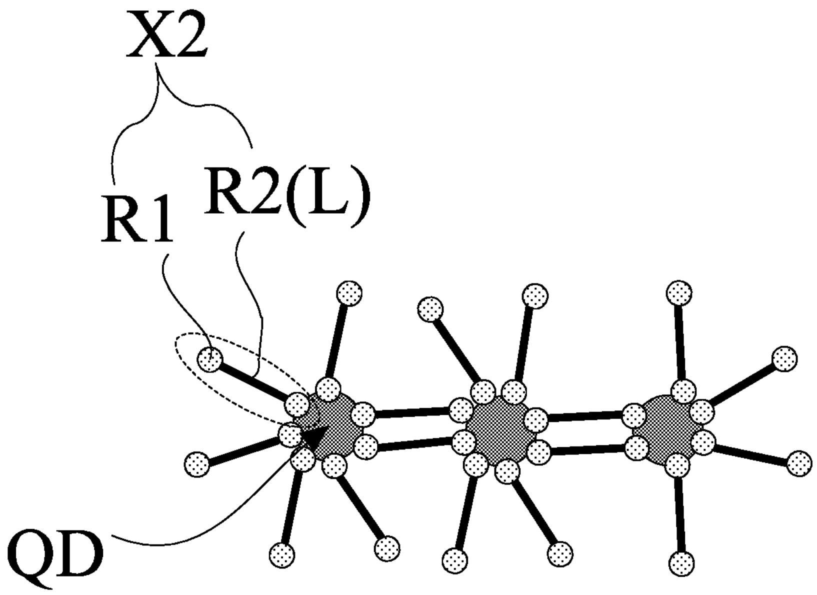
FIG. 9 is a schematic structural diagram of a quantum dot film layer according to an embodiment of the present disclosure.

In specific implementation, referring to FIG. 9, the replacement ligands X2 are ligands having a plurality of coordinating terminals, wherein each ligand having the plurality of coordinating terminals includes: a linking group L, and a plurality of terminal coordinating groups R1 connected to the linking group L; wherein different terminal coordinating groups R1 of a same ligand having the plurality of coordinating terminals are connected to different quantum dot bodies QDs, so that different quantum dot bodies QDs are crosslinked with each other through the ligands having the plurality of coordinating terminals. Of course, it should be noted that in the quantum dot film layer, there may be a case where part of the terminal coordinating groups R1 of part of the ligands having the plurality of coordinating terminals are not connected to the quantum dot bodies QDs, such as the quantum dot bodies QDs located at the edges in FIG. 9. In addition, FIG. 9 is merely a schematic illustration in which ligands having a plurality of coordinating terminals are ligands having double coordinating terminals containing two terminal coordinating groups R1, and in specific implementation, the ligand having the plurality of coordinating terminals may also contain a structure of three terminal coordinating groups R1 or four terminal coordinating groups R1, which is not limited thereto in the embodiments of the present disclosure.

In specific implementation, in connection with FIGS. 4, 5, and 6, the linking group L may include one sub-linking group R2, and the plurality of terminal coordinating groups R1 are connected to a same sub-linking group R2. In particular, the linking group L may also include a plurality of sub-linking groups R2 which are connected sequentially; and at least one terminal coordinating group R1 is connected to each sub-linking group R2. In particular, the sub-linking groups R2 are the same; or, the sub-linking groups R2 are different from each other. In particular, the sub-linking group R2 may be an alkyl chain. Further, the sub-linking group R2 may include one of ethyl, n-butyl, tert-butyl, n-octyl, tert-butylphenyl, methoxy and n-butoxy.

In specific implementation, the terminal coordinating group R1 includes one of amino, polyamino, hydroxyl, polyhydroxy, mercapto, polythiol, thioether, polythioether, phosphine; and phosphine oxide.

Figure 10:
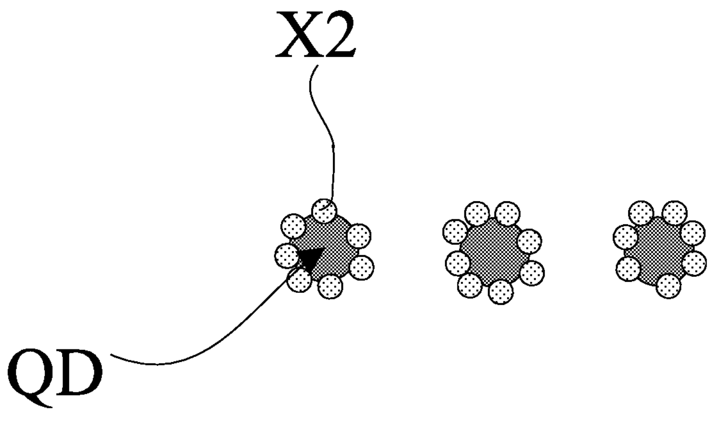
FIG. 10 is a schematic structural diagram of another quantum dot film layer according to an embodiment of the present disclosure.

In specific implementation, referring to FIG. 10, the replacement ligands X2 may be insoluble ligands. In particular, the insoluble ligand is one of iodide ions, chloride ions, bromide ions, —S2−, —HS−, —Se2−, —HSe−, —Te2−, —HTe−, —TeS32−, —OH−, —NH2−, —Sn2S64−, —N2H5+, —CdCl3−, —Te2−, —PO43− and —MoO42−.

Based on the same inventive concept, an embodiment of the present disclosure also provides a quantum dot light-emitting device, including: a base substrate, a first electrode stacked on one side of the base substrate, a quantum dot film layer, and a second electrode; wherein the quantum dot film layer includes the patterned quantum dot film layer provided by embodiments of the present disclosure.

In some embodiments, the quantum dot light-emitting device may be of an upright structure, the first electrode is a positive electrode, and the second electrode is a negative electrode, i.e., one side of the base substrate is sequentially provided with the first electrode (the positive electrode), the quantum dot film layer, and the second electrode (the negative electrode). In some embodiments, the quantum dot light-emitting device may also be of an inverted structure, the first electrode is a negative electrode, and the second electrode is a positive electrode, i.e., one side of the base substrate is sequentially provided with the first electrode (the negative electrode), the quantum dot film layer, and the second electrode (the positive electrode).

In order to provide a clearer understanding of the manufacturing method for the patterned quantum dot film layer provided by embodiments of the present disclosure, in connection with FIG. 2, description is made as follows by specific examples.

Step 1: introduction of red quantum dots in a red pixel region, wherein a specific process is as follows.

(1) cleaning, ITO glass (i.e., a glass substrate as a base substrate on which a first electrode is formed, a material of the first electrode being indium tin oxide ITO) is ultrasonically cleaned with isopropanol, water, and acetone, respectively, and is subjected to UV treatment for 5-10 min.

(2) Spin coating of a zinc oxide thin film (the zinc oxide thin film may serve as a front film layer, a light-emitting device may be of an inverted structure, and the zinc oxide thin film may serve as an electron transport layer), 2 g of zinc acetate is added to a solvent containing 10 mL of ethanolamine and n-butanol to be spin coated to form a film, with a revolution speed of 1000-4000 rpm, and heated to form a film at a heating stage of 180-250° C.

(3) Spin coating of a photoresist, the photoresist is added dropwise onto the ITO substrate, and a revolution speed of a spin coater is selected to be 500-4000 rpm.

(4) Mask exposure, mask exposure is performed on the red pixel region on the ITO glass.

(5) Development, the exposed ITO glass is soaked in a developer for 30-120 s, and blown dry. The red pixel region is exposed while the green and blue pixel regions are protected to be covered by the photoresist.

(6) Spin coating of red quantum dots, a low-boiling-point solution (chloroform, toluene, n-hexane, n-octane, or n-heptane, etc.) of red quantum dots containing native ligands is spin coated onto the above substrate, and dried at 80° C.-120° C. to form a film.

(7) Exchange with ligands having double coordinating terminals, 1-5% by volume of a solution of 1,12-dodecyldithiol

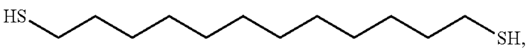

( a solution containing replacement ligands being ligands having a plurality of coordinating terminals before replacement, wherein —SH is a terminal coordinating group R1 and

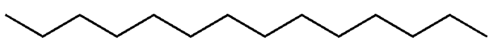

is used as a linking group L) in acetonitrile (an ethanol or dimethyl sulfoxide solution may also be used) covers the quantum dot film, and is allowed to stand for 30-120 s to allow the quantum dot film to undergo ligand exchange.

(8) Cleaning, the substrate is cleaned for three times with acetonitrile under dynamic spin coating conditions to clean away unreacted ligands and exchanged original ligands.

(9) Peeling off, the photoresist is peeled off to form red patterned quantum dots.

Step 2: Introduction of green quantum dots in a green pixel region.

(1) Spin coating of a photoresist, the photoresist is added dropwise onto the ITO substrate, and a revolution speed of a spin coater is selected to be 500-4000 rpm.

(2) Mask exposure, mask exposure is performed on the red pixel region on the ITO glass.

(3) Development, the exposed ITO glass is soaked in a developer for 30-120 s, and blown dry. The green pixel region is exposed while the red and blue pixel regions are protected to be covered by the photoresist.

(4) Spin coating of green quantum dots, a low-boiling-point solution (chloroform, toluene, n-hexane, n-octane, or n-heptane, etc.) of green quantum dots containing native ligands is spin coated onto the above substrate, and dried at 80° C.-120° C. to form a film.

(5) Exchange with ligands having double coordinating terminals, 1%-5% by volume of a solution of 1,12-dodecyldithiol in acetonitrile (an ethanol or dimethyl sulfoxide solution can also be used) covers the quantum dot film, and is allowed to stand for 30-120 s to allow the quantum dot film to undergo ligand exchange.

(6) Cleaning, the substrate is cleaned for three times with acetonitrile under dynamic spin coating conditions to clean away unreacted ligands and exchanged original ligands.

(7) Peeling off, the photoresist is peeled off to form green patterned quantum dots.

Step 3: Introduction of blue quantum dots in a blue pixel region.

(1) Spin coating of a photoresist, the photoresist is added dropwise onto the ITO substrate, and a revolution speed of a spin coater is selected to be 500-4000 rpm.

(2) Mask exposure, mask exposure is performed on the red pixel region on the ITO glass.

(3) Development, the exposed ITO glass is soaked in a developer for 30-120 s, and blown dry. The blue pixel region is exposed while the red and green pixel regions are protected to be covered by the photoresist.

(4) Spin coating of blue quantum dots, a low-boiling-point solution (chloroform, toluene, n-hexane, n-octane, or n-heptane, etc.) of blue quantum dots containing native ligands is spin coated onto the above substrate, and dried at 80° C.-120° C. to form a film.

(5) Exchange with ligands having double coordinating terminals, 1%-5% by volume of a solution of 1,12-dodecyldithiol in acetonitrile (an ethanol or dimethyl sulfoxide solution can also be used) covers the quantum dot film, and is allowed to stand for 30-120 s to allow the quantum dot film to undergo ligand exchange.

(6) Cleaning, the substrate is cleaned for three times with acetonitrile under dynamic spin coating conditions to clean away unreacted ligands and exchanged original ligands.

(7) Peeling off, the photoresist is peeled off to form blue patterned quantum dots.

Step 4: Introduction of a hole transport layer. A hole transport layer is spin-coated on the above ITO glass spin-coated with a light-emitting layer. As the hole transport layer, an organic matter such as Merck HT, or poly[(9,9-di-n-octylfluorenyl-2,7-diyl)-alt-(4,4'-(N-(4-n-butyl)phenyl)diphenylamine)] (TFB), or DuPont HT or the like may be selected, and heated to form a film. Merck HT is subjected to film formation at 200-230° C. in inert gas, TFB is subjected to film formation at 130-150° C. in inert gas, DuPont HT is subjected to film formation at 230-250° C. in inert gas, etc. The film layer thickness can be regulated according to the revolution speed of the spin coater.

Step 5: Introduction of a hole injection layer. A hole injection layer is spin coated on the above ITO glass. As the hole injection layer, an organic matter such as Merck HI, or Nissan 2520, or PEDOT 4083 or PEDOT 1.3 N, or DuPont HI, or the like can be selected, and heated to form a film. Merck HI is subjected to film formation at 200-230° C. in air, PEDOT is subjected to film formation at 130-150° C. in air, etc. The film layer thickness can be regulated according to the revolution speed of the spin coater.

Step 6: Introduction of a cathode. A cathode material is finally introduced, for example, an Al film is evaporated, or an indium zinc oxide (IZO) film is sputtered to manufacture a quantum dot light-emitting device.

Step 7: Encapsulation. Covering is performed with an encapsulation cover plate, and under the excitation of ultraviolet, etc., the device is encapsulated with a ultraviolet curing adhesive to manufacture quantum dot light-emitting diodes.

Although preferred embodiments of the present disclosure have been described, those skilled in the art can make additional changes and modifications to these embodiments once they know the basic inventive concepts. Therefore, the appended claims are intended to be explained as including the preferred embodiments and all changes and modifications falling within the scope of the present disclosure.

Obviously, those skilled in the art can make various changes and modifications to the embodiments of the present disclosure without departing from the spirit and scope of the embodiments of the present disclosure. Thus, if these changes and modifications of the embodiments of the present disclosure fall within the scope of the claims of the present disclosure and their equivalents, the present disclosure is also intended to include these changes and modifications.

What is claimed is:

1. A manufacturing method for a patterned quantum dot film layer, comprising:

forming a patterned mask layer on one side of a base substrate, wherein the patterned mask layer exposes a target region in which quantum dot bodies are to be formed;

forming a quantum dot thin film on a side, facing away from the base substrate, of the patterned mask layer, wherein the quantum dot thin film comprises the quantum dot bodies, and native ligands connected to the quantum dot bodies;

forming a ligand thin film containing replacement ligands on a side, facing away from the patterned mask layer, of the quantum dot thin film, and standing for a first duration, such that the native ligands are replaced by the replacement ligands;

performing cleaning by a cleaning solvent to remove unreacted replacement ligands and replaced native ligands, wherein the quantum dot bodies connected to the replacement ligands are not removed by the cleaning solvent; and peeling off the patterned mask layer, and together removing the quantum dot thin film attached to the patterned mask layer, so as to form a pattern part of a quantum dot film layer in the target region;

wherein the forming the ligand thin film containing the replacement ligands on the side, facing away from the patterned mask layer, of the quantum dot thin film, and standing for the first duration, such that the native ligands are replaced by the replacement ligands, comprises:

forming the ligand thin film containing replacement ligands comprising a plurality of coordinating terminals on the side, facing away from the patterned mask layer, of the quantum dot thin film, wherein each of the replacement ligands comprising the plurality of coordinating terminals comprises a linking group, and a plurality of terminal coordinating groups connected to the linking group; and replacing the native ligands by the replacement ligands comprising the plurality of coordinating terminals, and connecting different terminal coordinating groups of the replacement ligand comprising the plurality of coordinating terminals to different quantum dot bodies, so that the different quantum dot bodies are crosslinked with each other through the replacement ligand comprising the plurality of coordinating terminals.

2. The manufacturing method according to claim 1, wherein the forming the ligand thin film containing the replacement ligands comprising the plurality of coordinating terminals on the side, facing away from the patterned mask layer, of the quantum dot thin film, comprises:

forming, on the side, facing away from the patterned mask layer, of the quantum dot thin film, the ligand thin film with the terminal coordinating groups containing one of:

amino;
polyamino;
hydroxy;
polyhydroxy;
mercapto;
polythiol;
thioether;
polythioether;
phosphine; and
phosphine oxide.

3. The manufacturing method according to claim 2, wherein the forming the ligand thin film containing the replacement ligands comprising the plurality of coordinating terminals on the side, facing away from the patterned mask layer, of the quantum dot thin film comprises:

forming, on the side, facing away from the patterned mask layer, of the quantum dot thin film, the ligand thin film with the linking groups containing one of:

ethyl;
n-butyl;
tert-butyl;
n-octyl;
tert-butylphenyl;
methoxy; and
n-butoxy.

4. The manufacturing method according to claim 1, wherein the forming the ligand thin film containing the replacement ligands comprising the plurality of coordinating terminals on the side, facing away from the patterned mask layer, of the quantum dot thin film comprises:

forming the ligand thin film containing 1,12-dodecyldithiol on the side, facing away from the patterned mask layer, of the quantum dot thin film.

5. The manufacturing method according to claim 1, wherein the forming the ligand thin film containing the replacement ligands on the side, facing away from the patterned mask layer, of the quantum dot thin film, and standing for the first duration, such that the native ligands are replaced by the replacement ligands, comprises:

forming the ligand thin film containing insoluble ligands on the side, facing away from the patterned mask layer, of the quantum dot thin film, wherein a chain length of each insoluble ligand is less than a chain length of each native ligand; and replacing the native ligands by the insoluble ligands, so that the quantum dot bodies are adsorbed onto the base substrate.

6. The manufacturing method according to claim 5, wherein the forming the ligand thin film containing the insoluble ligands on the side, facing away from the patterned mask layer, of the quantum dot thin film, comprises:

forming the ligand thin film containing an inorganic salt or containing an organic salt on the side, facing away from the patterned mask layer, of the quantum dot thin film.

7. The manufacturing method according to claim 6, wherein the forming the ligand thin film containing the insoluble ligands on the side, facing away from the patterned mask layer, of the quantum dot thin film, comprises:

forming, on the side, facing away from the patterned mask layer, of the quantum dot thin film, the ligand thin film containing one of: iodide ions, chloride ions, bromide ions, $—S^{2}–$, $—HS–$, $—Se^{2}–$, $—HSe$, $—Te^{2}–$, $—HTe^{-}$, $—TeS_{3}^{2}–$, $—OH^{-}$, $—NH^{2-}$, $—Sn_{2}S_{6}^{4-}$, $—N_{2}H_{5}^{+}$, $—CdCl_{3}^{-}$, $—Te^{2-}$, $—PO_{4}^{3-}$, and $—MoO_{4}^{2-}$.

8. The manufacturing method according to claim 1, wherein the forming the ligand thin film containing the replacement ligands on the side, facing away from the patterned mask layer, of the quantum dot thin film, and standing for the first duration, such that the native ligands are replaced by the replacement ligands, comprises:

forming the ligand thin film containing the replacement ligands on the side, facing away from the patterned mask layer, of the quantum dot thin film, and standing for the first duration under the condition of no ultraviolet light source irradiation, such that the native ligands are replaced by the replacement ligands.

9. The manufacturing method according to claim 1, wherein the forming the quantum dot thin film on the side, facing away from the base substrate, of the patterned mask layer comprises:

forming the quantum dot thin film containing the quantum dot bodies, and oleic acid ligands connected to the quantum dot bodies on the side, facing away from the base substrate, of the patterned mask layer.

* * * * *